United States Patent
Kim

[19]

[11] Patent Number: 5,930,177
[45] Date of Patent: Jul. 27, 1999

[54] BUFFER CONTROL CIRCUIT AND METHOD FOR SEMICONDUCTOR MEMORY DEVICE WITH POWER SAVING FUNCTION

[75] Inventor: Yong Ki Kim, Ichon-shi, Rep. of Korea

[73] Assignee: Hyundai Electronics Industries Co., Ltd., Ichon-Shi, Rep. of Korea

[21] Appl. No.: 08/998,572

[22] Filed: Dec. 29, 1997

[30] Foreign Application Priority Data

Dec. 31, 1996 [KR] Rep. of Korea ............ 96-80258

[51] Int. Cl.$^6$ ..................... G11C 16/04
[52] U.S. Cl. ............. 365/189.05; 365/189.08
[58] Field of Search ............. 365/189.05, 189.08, 365/226, 227, 230.08

[56] References Cited

U.S. PATENT DOCUMENTS

| | | | |
|---|---|---|---|
| 4,970,694 | 11/1990 | Tanaka et al. | 365/233 |
| 5,338,978 | 8/1994 | Larsen et al. | 326/21 |
| 5,546,021 | 8/1996 | Bizuneh et al. | 326/86 |
| 5,594,704 | 1/1997 | Konishi et al. | 365/233 |

*Primary Examiner*—David Nelms
*Assistant Examiner*—Trong Phan
*Attorney, Agent, or Firm*—Thelen Reid & Priest LLP

[57] ABSTRACT

A buffer control circuit and method for a semiconductor memory device with a power saving function power saving function. The buffer control circuit includes an internal clock signal generator for generating an internal clock signal in response to an external clock signal, an internal chip select signal generator for generating an internal chip select signal in response to an external chip select signal, a buffer control signal generator for combining the internal clock signal from the internal clock signal generator and the internal chip select signal from the internal chip select signal generator to generate a buffer control signal, a command/address buffering circuit operative in response to the buffer control signal from the buffer control signal generator, for storing external input command and address, and a decoder for decoding commands from the command/address buffering circuit. According to the present invention, the amount of current being consumed at a standby state of the semiconductor memory device can be reduced.

6 Claims, 3 Drawing Sheets

BUFFER CONTROL CIRCUIT AND METHOD FOR SEMICONDUCTOR MEMORY DEVICE WITH POWER SAVING FUNCTION

BACKGROUND OF THE INVENTION

1. Field of the Invention

The present invention relates in general to saving power of a semiconductor memory device, and more particularly to a buffer control circuit and method for a synchronous dynamic random access memory (referred to hereinafter as DRAM) with a power saving function, in which a signal generator generates a command/address input buffer control signal in an improved manner to reduce the amount of current being consumed at a standby state of the synchronous DRAM. The present invention is applicable to all synchronous memory devices.

2. Description of the Prior Art

Generally, a synchronous DRAM basically has a power down mode for saving power of the device. The power down mode has the effect of saving a considerable amount of power as a whole by reducing the amount of current being consumed at a standby state of the synchronous DRAM.

The power down mode is performed according to a logic state of a clock enable signal which is a "high" active signal. When the clock enable signal is high in logic, a main clock signal is transferred from the outside of a chip to the inside thereof, and the input of a command and address is enabled.

To the contrary, in the case where the clock enable signal is low in logic, the main clock signal is not transferred from the outside of the chip to the inside thereof. Also, command/address input buffers enter an inactive state (off state) to reduce a static current consumption amount. In other words, the power down mode is performed when the clock enable signal is low in logic.

However, when the present mode is not the power down mode, namely, when the clock enable signal is high in logic, the command/address input buffers are made active, resulting in continuous power consumption.

The reason for this is that the command/address input buffers must always be made active at the standby state to be ready to input a new command and a new address.

Further, a command input clock point has to be synchronized with a chip select signal.

As a result, under the above-mentioned prescription, namely, unless the specification is modified, the existing techniques have no choice but to depend on the logic state of the clock enable signal to generate a buffer control signal. In other words, the buffer control signal is conventionally generated by using a second or third signal derived from the clock enable signal.

In brief, when the clock enable signal is high in logic, the current mode is not the power down mode and all the buffers are at the input standby state. For this reason, a standby current flows continuously at the buffer stage, thereby increasing the power consumption amount.

Particularly, such a phenomenon results in a considerable amount of power consumption in a system employing a battery as a power source.

The cause of current being consumed at the standby state of the input buffers as stated previously is as follows.

Most devices manufactured at the present are composed of CMOS transistor logics. The internal logics of the devices have a rail-to-rail operating characteristic where the amount of static current consumed in all intervals except logic transition intervals is nearly zero.

However, an input buffer for receiving a signal from the outside of the device has a different logic state from that of the internal logic, as follows.

First, the input buffer has a value higher than or equal to "VIH" at a high logic state. Here, "VIH" signifies a minimum voltage value for indicating that the input buffer is high in logic. Accordingly, the input buffer consumes a static current at the high logic state where it has a voltage value between "VIH" and "VDD".

Similarly, the same phenomenon appears at a low logic state.

As a result, a switch capable of selectively operating the buffer has been proposed by most buffer design techniques to reduce the static current amount.

SUMMARY OF THE INVENTION

Therefore, the present invention has been made in view of the above problems, and it is an object of the present invention to provide a buffer control circuit and method for a synchronous DRAM with a power saving function, in which the amount of current being consumed when the current mode of the synchronous DRAM is not a power down mode can effectively be reduced with no modification of the existing specification prescribing the operation of the DRAM.

In accordance with one aspect of the present invention, there is provided a buffer control circuit for a semiconductor memory device with a power saving function, comprising first detection means for detecting a logic state of an external clock signal; second detection means for detecting a logic state of an external chip select signal; and buffer control signal generation means for combining output signals from the first and second detection means to generate a buffer control signal; whereby the amount of current being consumed at a standby state of the semiconductor memory device can be reduced.

In accordance with another aspect of the present invention, there is provided a buffer control circuit for a semiconductor memory device with a power saving function, comprising internal clock signal generation means for generating an internal clock signal in response to an external clock signal; internal chip select signal generation means for generating an internal chip select signal in response to an external chip select signal; buffer control signal generation means for combining the internal clock signal from the internal clock signal generation means and the internal chip select signal from the internal chip select signal generation means to generate a buffer control signal; command/address buffering means operative in response to the buffer control signal from the buffer control signal generation means, for storing external input command and address; and decoding means for decoding commands from the command/address buffering means; whereby the amount of current being consumed at a standby state of the semiconductor memory device can be reduced.

In accordance with yet another aspect of the present invention, there is provided a buffer control method for a semiconductor memory device with a power saving function, comprising the first step of generating a buffer control signal according to a logic state of an external chip select signal when the present mode of the semiconductor memory device is not a power down mode but a standby mode, the external chip select signal indicating the presence of an external input command; and the second step of controlling an operation of a buffering circuit in response to the generated buffer control signal to prevent current from being consumed at the standby mode.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Under the condition that the current mode of a DRAM is not a power down mode, an input buffer must be ready to input a command.

Such a command is inputted together with a chip select signal synchronously with a clock to indicate the selection of the corresponding chip and generate a control signal for strobing such a situation.

That is, all command/address input buffers are significant only when the chip select signal is made active low, and all commands applied in other intervals are invalid.

Therefore, the present invention provides a DRAM device in which a buffer operation is controlled using the above-mentioned characteristic in such a manner that it is not performed when no external command is inputted at a standby state of the device.

Figure 2:
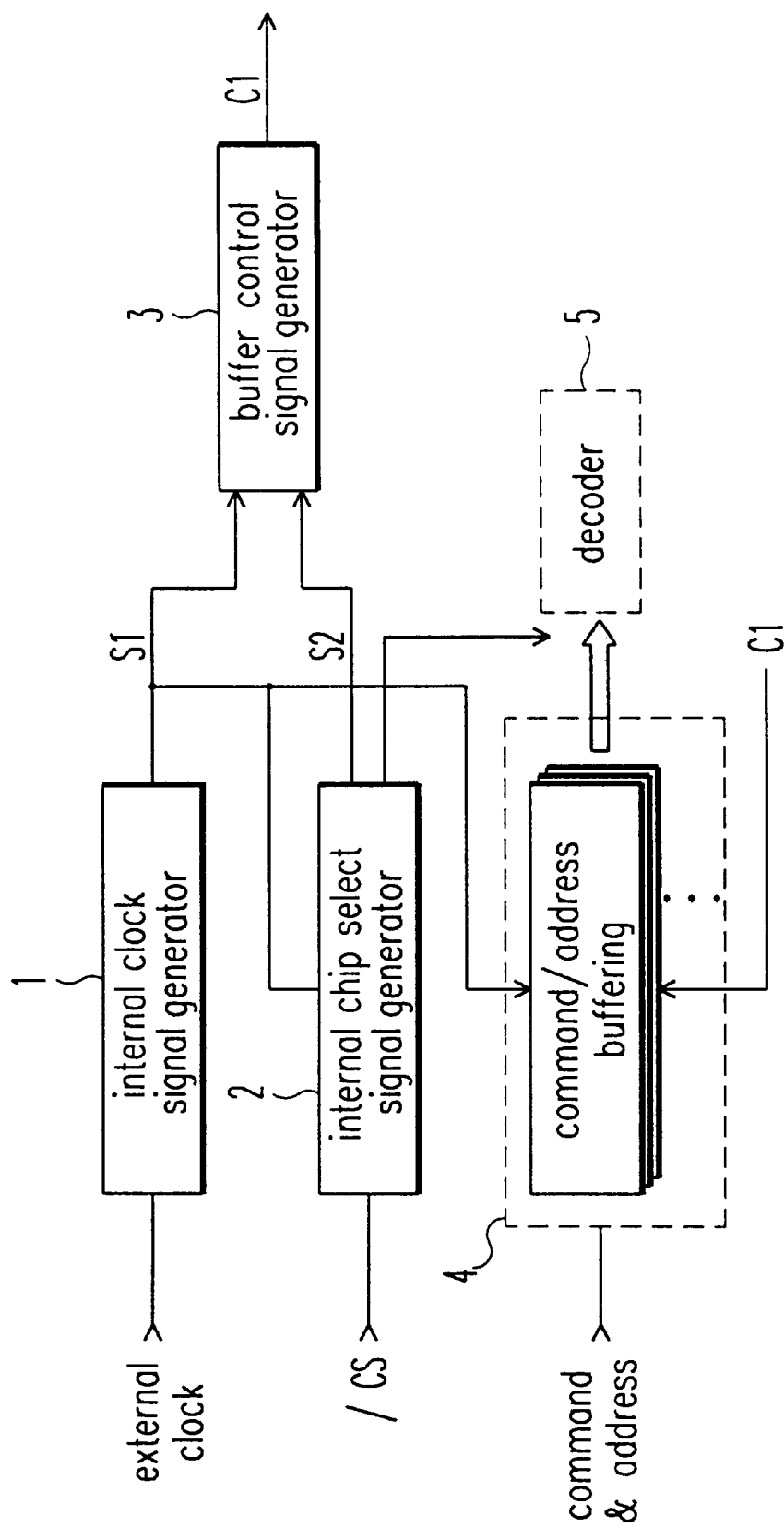
FIG. 2 is a block diagram of the buffer control circuit for the synchronous DRAM with the power saving function in accordance with the present invention.

FIG. 2 is a block diagram of a buffer control circuit for a synchronous DRAM with a power saving function in accordance with the present invention. As shown in this drawing, the buffer control circuit comprises an internal clock signal generator 1 for generating an internal clock signal in response to an external clock signal, an internal chip select signal generator 2 for generating an internal chip select signal in response to an external chip select signal and the internal clock signal from the internal clock signal generator 1, and a buffer control signal generator 3 for generating a buffer control signal in response to the internal clock signal from the internal clock signal generator 1 and the internal chip select signal from the internal chip select signal generator 2.

When a clock enable signal is enabled and the chip select signal is disabled, the buffer control signal from the buffer control signal generator 3 is made active to control a buffer operation, as will later be mentioned in detail.

In accordance with the present invention, the standby state of all input buffers is controlled by the chip select signal. Namely, all command/address input buffers are made active only when the chip select signal is low in logic.

After the input of a command and address is completed, the command/address input buffers are made inactive at the subsequent clock where the chip select signal is disabled high, thereby allowing no further standby current to be consumed.

In this connection, the present invention provides the following characteristics.

First, the buffer control signal is generated to control the enabling of the command/address input buffers. Only when the buffer control signal is made active, the corresponding command/address input buffers are enabled to enter the command/address input standby state.

Second, the internal chip select signal is generated to be used for the generation of the buffer control signal. The internal chip select signal is different in phase from the external chip select signal which selects the corresponding chip and strobes the command input.

Third, the internal clock signal is generated to be used for the generation of the buffer control signal. The internal clock signal is generated synchronously with a positive edge of the external clock signal.

Figure 1:
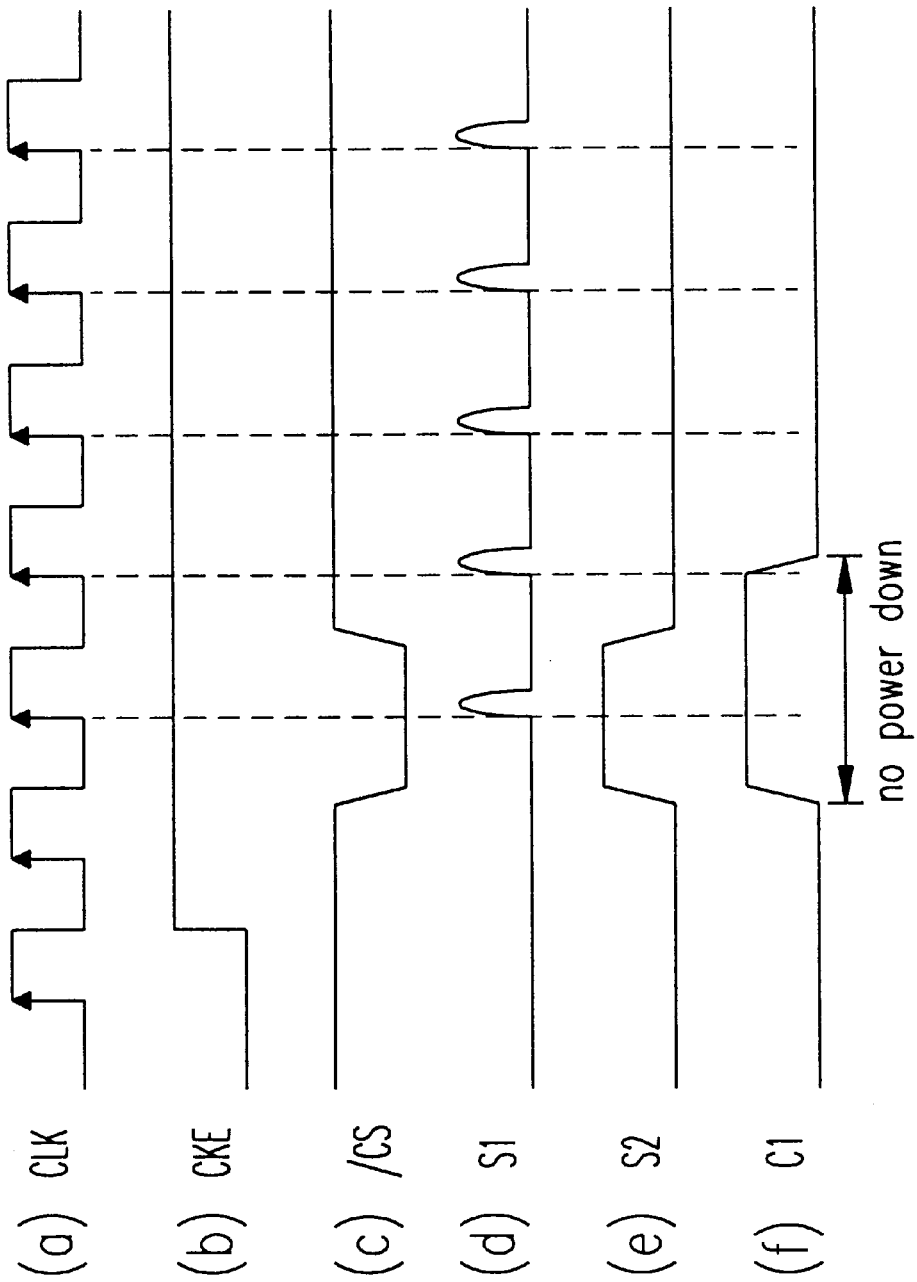
FIGS. 1a to 1f are timing diagrams illustrating the operation of a buffer control circuit for a synchronous DRAM with a power saving function in accordance with the present invention.

FIGS. 1a to 1f are timing diagrams illustrating the operation of the buffer control circuit for the synchronous DRAM with the power saving function in accordance with the present invention. In FIG. 1a, "CLK" designates the external clock signal. In FIG. 1b, "CKE" designates a clock enable signal which controls the enabling of the external clock signal CLK to make a power down mode active. In FIG. 1c, "/CS" designates the external chip select signal.

In FIG. 1d, "S1" designates the internal clock signal which is generated in a pulse form at a positive edge of the external clock signal CLK. In FIG. 1e, "S2" designates the internal chip select signal which has the opposite phase to the external chip select signal /CS. in FIG. 1f, "C1" designates the buffer control signal which is generated by combining the internal clock signal S1 and the internal chip select signal S2. The buffer control signal C1 is adapted to turn on/off command/address input buffers.

The buffer control signal C1 is a "low" active signal. When the clock enable signal CKE and the external chip select signal /CS are both high in logic, the buffer control signal C1 becomes low in logic.

When the buffer control signal C1 is low in logic, the command/address input buffers are controlled in such a manner that they cannot be operated.

That, an external input command, such as a row address strobe signal /RAS, column address strobe signal /CAS, write enable signal /WE or chip select signal /CS, and an address ADDR are not outputted from the command/address buffers but remain latched at the existing states. As a result, no standby current is consumed.

At the moment that the external chip select signal /CS is made active low, the internal chip select signal S2 becomes high in logic, thereby causing the buffer control signal C1 to go high in logic. As a result, the command/address input buffers enter a standby state.

Subsequently, the command/address input buffers are released from the above control to output the external input command and address.

Thereafter, if the external chip select signal /CS becomes again high in logic, the internal chip select signal S2 becomes low in logic, thereby causing the buffer control signal C1 to go low in logic. As a result, the command/address input buffers are controlled in such a manner that they cannot be operated.

Referring again to FIG. 2, the internal clock signal generator 1 is adapted to generate the internal clock signal S1 in the form of a pulse at each positive edge of the external clock signal CLK. The internal chip select signal generator 2 is adapted to generate the internal chip select signal S2 which has the opposite phase to the external chip select signal /CS. The buffer control signal generator 3 is adapted to combine the internal clock signal S1 from the internal clock signal generator 1 and the internal chip select signal S2 from the internal chip select signal generator 2 to generate the buffer control signal C1.

The buffer control circuit further comprises a command/address buffering circuit 4 operative in response to the buffer control signal C1 from the buffer control signal generator 3, for storing external input command and address, and a decoder 5 for decoding commands from the command/address buffering circuit 4.

The internal clock signal S1 from the internal clock signal generator 1 is used for the synchronization of output signals TOCOM1 and TOCOM2 from the internal chip select signal generator 2 and command/address buffering circuit 4.

Figure 3:
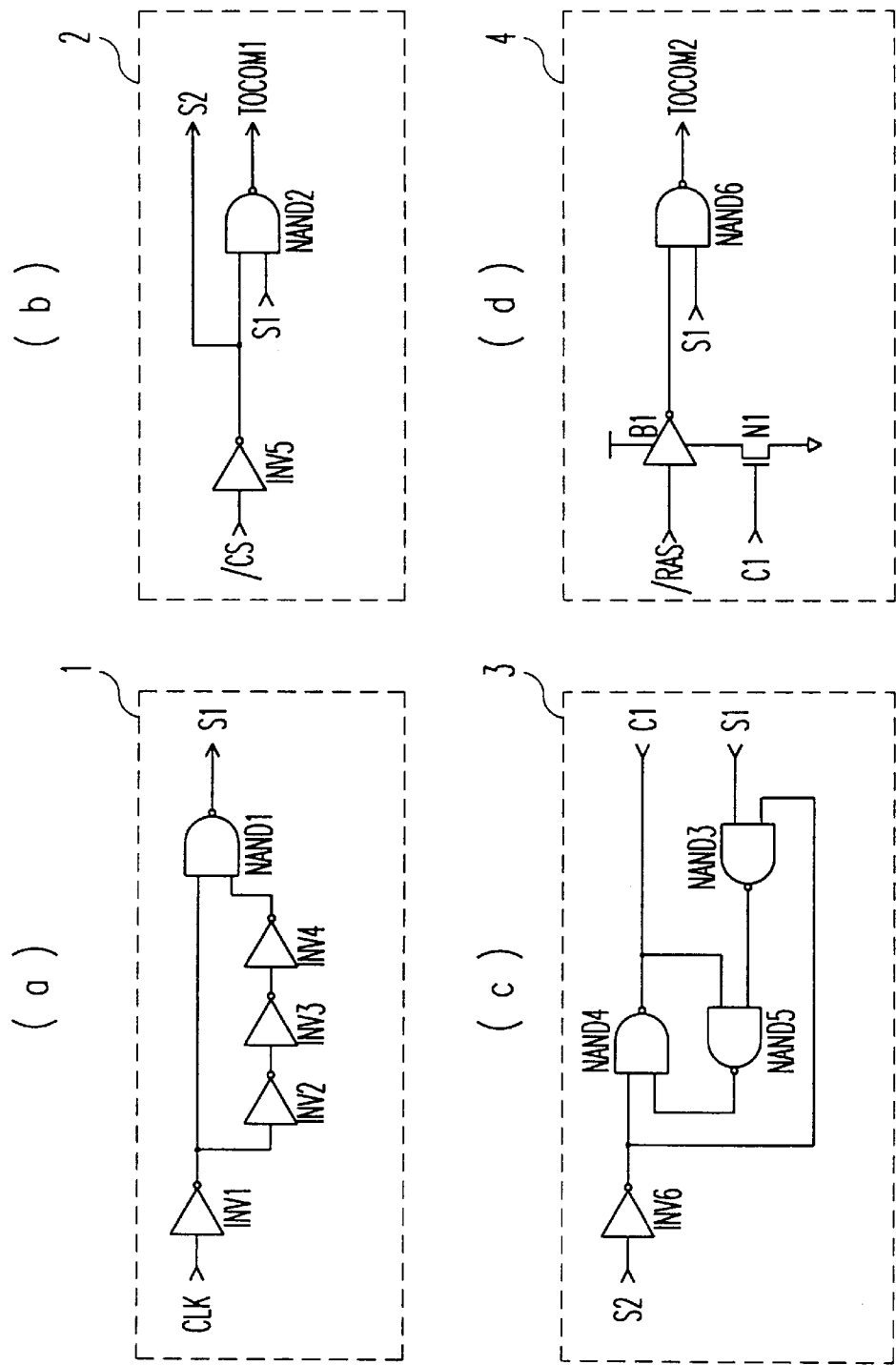
FIGS. 3a to 3d are detailed circuit diagrams of components in the buffer control circuit in FIG. 2.

FIGS. 3a to 3d are detailed circuit diagrams of the components in the buffer control circuit in FIG. 2. As shown in FIG. 3a, the internal clock signal generator 1 includes an inverter INV1 for inverting the external clock signal CLK, a plurality of inverters INV2–INV4 for delaying and inverting an output signal from the inverter INV1, and a NAND gate NAND1 for NANDing the output signal from the inverter INV1 and an output signal from the inverter INV4 and outputting the NANDed result as the internal clock signal S1.

As shown in FIG. 1b, the internal chip select signal generator 2 includes an inverter INV5 for inverting the external chip select signal /CS and outputting the inverted signal as the internal chip select signal S2, and a NAND gate NAND2 for NANDing the internal chip select signal S2 from the inverter INV5 and the internal clock signal S1 from the internal clock signal generator 1 and outputting the NANDed result as the signal TOCOM1 to the decoder 5. The signal TOCOM1 from the NAND gate NAND2 is used to determine the type of an external input command when the external chip select signal /CS is made active.

As shown in FIG. 3c, the buffer control signal generator 3 includes an inverter INV6 for inverting the internal chip select signal S2 from the internal chip select signal generator 2, a NAND gate NAND3 for NANDing an output signal from the inverter INV6 and the internal clock signal S1 from the internal clock signal generator 1, a NAND gate NAND5 for NANDing an output signal from the NAND gate NAND3 and the buffer control signal C1, and a NAND gate NAND4 for NANDing the output signal from the inverter INV6 and an output signal from the NAND gate NAND5 and outputting the NANDed result as the buffer control signal C1.

As shown in FIG. 3d, the command/address buffering circuit 4 includes a buffer B1 for buffering an external input command, an NMOS transistor N1 being turned on/off in response to the buffer control signal C1 from the buffer control signal generator 3 to control the operation of the buffer B1, and a NAND gate NAND6 for NANDing an output signal from the buffer B1 and the internal clock signal S1 from the internal clock signal generator 1 and outputting the NANDed result as the signal TOCOM2 to the decoder 5. The signal TOCOM2 from the NAND gate NAND6 is used to determine the type of an external input command when the external chip select signal /CS is made active.

The operation of the buffer control circuit with the above-mentioned construction in accordance with the present invention will hereinafter be described in detail.

Generally, a memory cell array is composed of rows and columns, and row and column addresses are inputted from the outside of the chip to access cells of the memory cell array. Also, address input buffers and registers are provided to store the row and column addresses. Under this condition, if the clock enable signal CKE and the external chip select signal /CS are both high in logic, the DRAM enters the standby state, as mentioned above. Then, the internal clock signal S1 from the internal clock signal generator 1 and the internal chip select signal S2 from the internal chip select signal generator 2 are applied to the buffer control signal generator 3.

In this case, the internal chip select signal S2 from the internal chip select signal generator 2 is low in logic.

In the buffer control signal generator 3, the internal chip select signal S2 from the internal chip select signal generator 2 is inverted into high in logic by the inverter INV6 and applied to the NAND gates NAND3 and NAND4.

The NAND gate NAND3 NANDs the output signal from the inverter INV6 and the internal clock signal S1 from the internal clock signal generator 1. As a result of the NANDing operation, the NAND gate NAND3 outputs a low logic signal to the NAND gate NAND5, which is also applied with the previous buffer control signal C1. At this time, the buffer control signal C1 is high in logic because it remains at its disable state.

As a result, the NAND gate NAND5 outputs a high logic signal to the NAND gate NAND4, which is also applied with the output signal from the inverter INV6, as mentioned above. Because the output signal from the NAND gate NAND5 and the output signal from the inverter INV6 are both high in logic, the NAND gate NAND4 outputs a low logic signal as the buffer control signal C1.

Then, in the command/address buffering circuit 4, the buffer control signal C1 from the buffer control signal generator 3 is applied to a gate of the NMOS transistor N1 to turn it off. As the NMOS transistor N1 is turned off, the buffer B1 is not operated.

Namely, the buffer B1 is not operated so that an input value therein cannot be outputted, resulting in the consumption of no current.

Such a power saving state is released when the subsequent pulse of the internal clock signal S1 is applied to the NAND gate NAND3 in the buffer control signal generator 3.

In other words, the switching means (i.e., the NMOS transistor N1) connected to the buffer B1 is used to control the buffer B1 in such a manner that it cannot be operated in the presence of no command. Therefore, the amount of current being consumed at the standby state (i.e., CKE="high" and /CS "high") of the synchronous DRAM can be reduced.

As apparent from the above description, according to the present invention, the amount of current being consumed in the command/address input buffers at the standby state of the synchronous DRAM are controlled by simply combining the logic elements. Therefore, the present invention has the effect of reducing the entire power consumption of the DRAM.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A buffer control circuit for a semiconductor memory device with a power saving function, comprising:

internal clock signal generation means for generating an internal clock signal in response to an external clock signal;

internal chip select signal generation means for generating an internal chip select signal in response to an external chip select signal;

buffer control signal generation means for combining said internal clock signal from said internal clock signal generation means and said internal chip select signal from said internal chip select signal generation means to generate a buffer control signal;

command/address buffering means operative in response to said buffer control signal from said buffer control signal generation means, for storing external input command and address; and decoding means for decoding commands from said command/address buffering means;

whereby the amount of current being consumed at a standby state of said semiconductor memory device can be reduced.

2. The buffer control circuit for a semiconductor memory device with a power saving function, as set forth in claim 1, wherein said internal clock signal generation means includes:

a first inverter for inverting said external clock signal;

a plurality of second inverters for delaying and inverting an output signal from said first inverter; and a NAND gate for NANDing the output signal from said first inverter and an output signal from the last one of said second inverters and outputting the NANDed result as said internal clock signal.

3. The buffer control circuit for a semiconductor memory device with a power saving function, as set forth in claim 1, wherein said internal chip select signal generation means includes:

an inverter for inverting said external chip select signal and outputting the inverted signal as said internal chip select signal; and a NAND gate for NANDing said internal chip select signal from said inverter and said internal clock signal from said internal clock signal generation means and outputting the NANDed result as a control signal to said decoding means, said control signal from said NAND gate determining the type of said external input command when said external chip select signal is made active.

4. The buffer control circuit for a semiconductor memory device with a power saving function, as set forth in claim 1, wherein said buffer control signal generation means includes:

an inverter for inverting said internal chip select signal from said internal chip select signal generation means;

a first NAND gate for NANDing an output signal from said inverter and said internal clock signal from said internal clock signal generation means;

a second NAND gate for NANDing an output signal from said first NAND gate and said buffer control signal; and a third NAND gate for NANDing the output signal from said inverter and an output signal from said second NAND gate and outputting the NANDed result as said buffer control signal.

5. The buffer control circuit for a semiconductor memory device with a power saving function, as set forth in claim 1, wherein said buffer control signal from said buffer control signal generation means is made active when a clock enable signal is enabled and said external chip select signal is disabled, to control an operation of said command/address buffering means.

6. The buffer control circuit for a semiconductor memory device with a power saving function, as set forth in claim 1, wherein said command/address buffering means includes:

a buffer for storing said external input command;

a switching element being turned on/off in response to said buffer control signal from said buffer control signal generation means to control an operation of said buffer; and a NAND gate for NANDing an output signal from said buffer and said internal clock signal from said internal clock signal generation means and outputting the NANDed result as a control signal to said decoding means, said control signal from said NAND gate determining the type of said external input command when said external chip select signal is made active.

\* \* \* \* \*